(12) United States Patent
Li et al.

(10) Patent No.: US 6,936,355 B2
(45) Date of Patent: Aug. 30, 2005

(54) ORGANIC PHOTOLUMINESCENT POLYMERS WITH IMPROVED STABILITY

(75) Inventors: X. Charles Li, Union City, CA (US); Kazunori Ueno, Kanagawa-ken (JP); Bing R. Hsieh, Webster, NY (US)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 10/160,057

(22) Filed: Jun. 4, 2002

(65) Prior Publication Data

US 2003/0227001 A1 Dec. 11, 2003

(51) Int. Cl.$^7$ .............................................. H05B 33/14
(52) U.S. Cl. ...................... 428/690; 428/704; 428/917; 430/321; 528/101; 528/104; 528/205; 528/377; 528/392; 252/301.16; 252/301.35; 313/504; 313/506; 257/40; 257/103; 427/66
(58) Field of Search ................................ 428/690, 704, 428/917; 430/321; 528/101, 104, 205, 377, 392; 252/301.16, 301.35; 313/504, 506; 257/40, 103; 427/66

(56) References Cited

U.S. PATENT DOCUMENTS

| | | | |
|---|---|---|---|
| 5,064,572 A | 11/1991 | Ohnishi et al. | 252/500 |
| 5,504,323 A | 4/1996 | Heeger et al. | 250/214.1 |
| 5,558,904 A | 9/1996 | Hsieh et al. | 427/66 |
| 5,670,603 A | 9/1997 | Wu et al. | 528/190 |
| 5,747,182 A | 5/1998 | Friend et al. | 428/690 |
| 5,869,350 A | 2/1999 | Heeger et al. | 438/29 |
| 5,900,327 A | 5/1999 | Pei et al. | 428/690 |
| 5,945,502 A | 8/1999 | Hsieh et al. | 528/101 |
| 5,966,393 A | 10/1999 | Hide et al. | 372/23 |
| 6,124,046 A | 9/2000 | Jin et al. | 428/690 |
| 6,579,630 B2 * | 6/2003 | Li et al. | 428/690 |
| 6,677,060 B2 * | 1/2004 | Li et al. | 428/690 |
| 6,686,067 B2 * | 2/2004 | Li et al. | 428/690 |
| 6,699,599 B2 * | 3/2004 | Li et al. | 428/690 |

FOREIGN PATENT DOCUMENTS

WO          02/47440 A1     6/2002

OTHER PUBLICATIONS

Ueno et al. (Design and Synthesis of Photoluminescent Deuterated Chromophores, Jpn. J Deuterium Sci, 2001, 10(1) pp. 25–34.*
"Exciton dffusion and dissociation in a poly(p–phenylenevinylene)/$C_{60}$ heterojunction photovoltaic cell" J.J.M. Halls, et al., Appl. Phys. Lett., (1996), vol. 68, No. 22, pp. 3120–3122.
"Mechanism of one– and two–photon absorption induced photoluminescence in PPV typ , electroluminescent polymer" Geon Joon Lee, et al., Elsevier Scinece B.V., (2002), vol. 203, pp. 151–157.

"Polymers for Electronics and Communications" Soonil D. Rughooputh, et al., University of Mauritius, Reduit, Mauritius, (1999), pp. 55–60.
"Solid–State $^2$H Quadrupole Echo NMR Characterization of Vinylene–Deuterated Poly(p–phenylenevinylene) Films" Jeffrey H. Sumpson, et al., American Chemical Society, (1992), vol. 25, pp. 3068–3074.
"Semiconducting (Conjugated) Polymers as Materials for Solid–State Lasers" Michael D. McGehee, et al., Advanced Materials, (2000), vol. 12, No. 22, pp. 1655–1668.
M. D. McGehee and A. Heeger, "Semiconducting (Conjugated) Polymers as Materials for Solid–State Lasers", Adv. Mater., 12(22), 1655–1668 (Nov., 2000).
J.H. Schon, et al, "An Organic Solid State Injection Laser", Science, 278, 599–601 (Jul., 2000).
Bing Hsieh et al., A New Family of Highly Emissive Soluble Poly(p–phenylene vinylene) Derivatives. A Step toward Fully Conjugated Blue–Emitting Poly(p–phenylene vinylenes), J. Am. Chem Soc., 120, 231–32 (Jan., 1998).
H. Becker et al., "Soluble PPVs with Enhanced Performance– A Mechanistic Approach", Adv. Mater., 12(1), 42–48 (Jan., 2000).

* cited by examiner

Primary Examiner—Ling Xu
(74) Attorney, Agent, or Firm—Fitzpatrick, Cella, Harper & Scinto (57) ABSTRACT

A luminescent polymer, suitable for use in an active layer of an organic light-emitting device, organic solid state lasers, a photovoltaic cell or an electrochromic display and exhibiting good stability and microstructure control, which has the structure

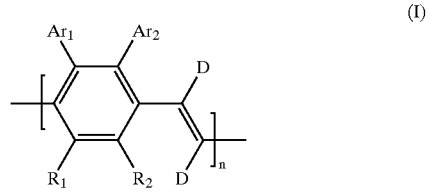

(I)

wherein $Ar_1$ and $Ar_2$ are aromatic or heteroaromatic rings, such as phenyl, biphenyl, fluorene, thiophene, pyridyl, or their substituted aromatic or heteroaromatic rings with or without deuterium, and $R_1$ and $R_2$ are independently each selected from the group consisting of hydrogen, deuterium, substituted or unsubstituted alkyl, alkoxyl, aryl and heteroaryl, or halogen, wherein D represents deuterium and n is an integer greater than 3. Electronic devices and methods of making them which employ these luminescent polymers are also described.

4 Claims, 5 Drawing Sheets

Figure 1. UV-Vis and PL spectral comparison of DP-PPV (Blue) with DP-PPV-d2

Figure 2. Cyclic voltametric curve of normal DP-PPV (dotted line in blue) and duterated DP-PPV-d2 (solid line).

Fig. 3. Illustration of UV irradiation experiment set up

Fig. 4. 3D illustration of the DP-PPV-d2 polymer

Figure 5. Schematic diagram of an organic solid state laser (OSL) device with surface-emitting planer Fabry-Perot resonator showing the pump beam focused onto the surface of the polymer film, and the OSL output beam emerging from the film edge.

ORGANIC PHOTOLUMINESCENT POLYMERS WITH IMPROVED STABILITY

BACKGROUND OF THE INVENTION

1. Field of the Invention

The present invention relates to luminescent polymers suitable for use in organic light-emitting devices (OLEDs), organic solid-state lasers, photovoltaic cells, and electrochromic displays. The invention further relates to a method of producing the luminescent polymers, and of producing OLEDs, organic solid state lasers, photovoltaic cells and electrochromic displays employing such luminescent polymers in an active layer.

2. Description of the Related Art

Conjugated polymer semi-conductors have attracted attention for optoelectronic applications that traditionally have been the domains of inorganic semi-conductors. The structural flexibility, the very low cost for processing, and the flexible thin film features of conjugated polymers make organic semi-conductive polymer devices competitive with the inorganic semiconductors. Most conjugated polymers are highly luminescent, and they have attracted great attention in light-emitting device applications and for use in organic solid-state lasers.

Recent improvements in performance characteristics of organic/polymer LEDs have led to renewed interest in organic lasers. Laser emission in general relies on two key ingredients: first, the active material must exhibit strong stimulated emission. Second, there has to be an optical feedback mechanism. The first requirement is fulfilled for a variety of state-of the-art conjugated polymers. The observation of gain narrowing via amplification of spontaneous emission (ASE) in planar conjugated polymer wave guides has proven that conjugated polymers can exhibit high optical gain comparable to the best inorganic semiconductor laser materials.(M. D. McGehee and A. Heeger, *Adv. Mater.*, 2000, 12(22), 1655–1668). The second important condition for lasing, namely an optical feedback, has to be accomplished by a suitable resonator geometry which is dependent on physical device configuration. Recent realization of the first organic solid state injection laser pumped by electrical charge injection reveals that the current is at the level of more than 1000 A/cm$^2$ for an electrically pumped organic solid state laser.(J. H. Schon, et al, *Science*, 2000, 278, 599–601). This is considerably much more than a normal OLED which is operated at a level of 10–100 mA/cm$^2$ (for a brightness between 100–1000 cd/m$^2$). The prospect of compact electrically pumped polymer lasers using their semi-conductor properties is exciting. However, there is indeed a need to develop highly luminescent and highly stabilized polymers.

Luminescent conjugated polymers are generally known in the art and include substituted and unsubstituted poly (phenylene vinylene)s and polyphenylenes. They are widely used in active layers which can be incorporated into a variety of OLED, organic solid-state laser, photovoltaic cell and electrochromic display structures. For all the above applications, polymers are either subject to electrical field, charge injection, or light irradiation conditions. Besides having the luminescence property, the other key parameter for these applications is the stability of the material under conditions of use, including high UV irradiation and high currents. Thus, the materials must maintain a high level of photoluminescent properties in use, as well as maintain their structural integrity.

Efforts to use these conjugated polymers commercially have focused on improving stability. It has been found that stability can be improved by the introduction of highly hindered aromatic rings, such as diphenyl-substituted poly (phenylene vinylene)s and phenyl-substituted poly (phenylene vinylene)s.(U.S. Pat. No. 5,945,502). Even with these improvements, however, stability is still unsatisfactory for use under certain conditions including high UV irradiation and high currents, both of which are normal conditions in OLEDs, organic solid state lasers, photovoltaic cells, and electrochromic displays.

SUMMARY OF THE INVENTION

It is an object of the present invention to provide luminescent polymers with improved stability, particularly against UV irradiation and high currents, and suitable for use in organic solid state lasers, OLEDs, photovoltaic cells, and electrochromic displays.

Accordingly, in one aspect the invention is a poly (phenylene vinylene) with a highly sterically hindered aromatic or heteroaromatic ring substitution on the phenylene portion, and deuterium substitution on the vinylene portion, as shown in the following structure:

(I)

wherein $Ar_1$ and $Ar_2$ are aromatic or heteroaromatic rings, such as phenyl, biphenyl, fluorene, thiophene, pyridyl, or their substituted aromatic or heteroaromatic rings with or without deuterium. $R_1$ and $R_2$ are independently each selected from the group consisting of hydrogen, deuterium, substituted or unsubstituted alkyl, alkoxyl, aryl and heteroaryl, or halogen such as chlorine, fluorine, bromine etc. D represents deuterium, and n is an integer greater than 3.

In preferred embodiments, $R_1$ and $R_2$ are the same and are selected from the group consisting of substituted or unsubstituted alkyl, alkoxyl, aryl and heteroaryl. Most preferably, $Ar_1$ and $Ar_2$ are phenyl or pyridyl or substituted phenyl or pyridyl.

In particularly preferred embodiments, the luminescent polymers are:

Formula 1

Formula 2

Formula 3

Formula 4

Formula 5

Formula 6

In the above formulas X, Y=F, Cl, Br, CN, $NO_2$, $OR_1$, $SR_1$, phenyl, pyridyl, thiophene $R_1$, $R_2$=H, alkyl (1–20), alkoxyl (1–20), F, Cl, Br.

The above-described luminescent polymers exhibit good stability, particularly under UV irradiation and high current injection. The polymers are soluble, with well-controlled microstructure and, as a consequence, are suitable for formation into the active layer of OLEDs, organic solid state lasers, photovoltaic cells and electrochromic displays. Preferred embodiments are particularly well-suited for formation of such layers by solution processing, such as spin-coating and printing processes.

In a further aspect, the present invention is an organic light emitting device, an organic solid state laser, and a method for producing such devices, comprising a transparent electrode; a cathode; and an active layer containing a luminescent polymer having the structure of formula (I).

In a still further aspect, the present invention is a photovoltaic cell, and a method for producing such a cell, comprising an active layer containing a luminescent polymer having the structure of formula (I).

In another aspect, the present invention is an electrochromic display, and a method for producing such a display, comprising an active layer containing a luminescent polymer having the structure of formula (I).

In a related aspect, the invention is a method of making a luminescent polymer having a structure as set out in formula (I), comprising the steps of deuteration of the monomers, and the 1,6-dehalogenation polymerization reaction.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION OF THE INVENTION

The present invention provides conjugated luminescent polymers or copolymers which present better stability against current and against UV light irradiation. Amongst various conjugated polymers, poly(phenylene vinylene) (PPV) and its derivatives remain as the most important conjugated polymers for the use in opto-electronic applications. This is because PPVs can be molecularly engineered to provide various derivatives with different emissive colors, such as red, green, yellow and bluish green, by changing the side substituted groups of the polymer. PPVs with extremely high molecular weight can also be easily achieved (with Mw higher than $10^6$). Many applications of conjugated PPVs in the area of photovoltaic cells, light-emitting devices, electrochromic displays, and organic lasing etc, have been reported. For almost all the above applications, the paramount important requirement is the improvement of material stability.

Di-phenyl substituted poly(phenylene vinylene) has been developed as a good green luminescent polymer. It has a better stability against photo-irradiation than some other derivatives, such as 2-methoxy-5-(2'-ethyl-hexyl)-poly(1,4-phenylenevinylene) (MEH-PPV).

In order to further enhance the stability of the vinyl bonds along the conjugated polymer chain, deuterium substituted polymer has been explored. The difference between hydrogen and deuterium has fairly small chemical effects; however, there are important physical effects because of the mass difference between the isotopes, with deuterium having double the mass of hydrogen. It is known that the C-D bond is shorter than the C—H as a result of anharmonicity of the bond stretching potential. This means the carbon-deuterium chemical bond is stronger, more stable, and reacts more slowly than the carbon-hydrogen chemical bond, so that the deuterium organic system has better thermal stability, and a longer lifetime in opto-electronic devices. Deuterium is found to act as an apparent electron-donating inductive substituent relative to hydrogen. The isotope effects may be applied in the design of new luminescent material with enhanced charge-injection ability.

Various PPV-based luminescent materials containing deuterium have been prepared to investigate their suitability for use in OLEDs.

EXAMPLE 1

Synthesis of a soluble green luminescent diphenyl-substituted PPV with deuterium substitution has been carried out as described in Scheme 1.

The deuterium reaction mechanism is illustrated in Scheme 2. As is shown, it is possible to obtain the deuterium DP-PPV with the readily available starting material $LiAlD_4$.

Scheme 2. Deuterium reaction mechanism

The resulting polymer has a melting point around 285° C. Due to the diphenyl steric effect, combined with the stabilization effect of deuterium, the green luminescent DP-PPV-d2 has a better stability against light irradiation and against thermal curing than the non-deuterated polymer.

Figure 4:
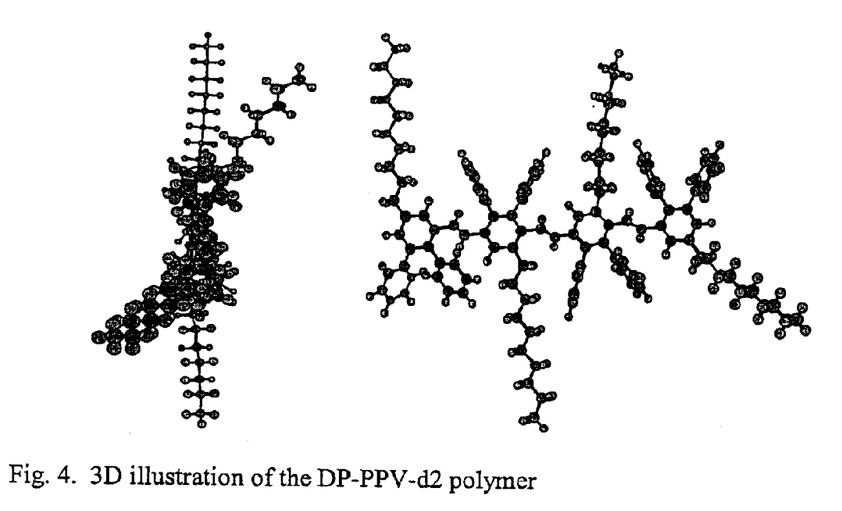
FIG. 4 is a three-dimensional illustration of a DP-PPV-d2 polymer.

The three dimensional features of a DP-PPV-d2 polymer are illustrated in FIG. 4.

Figure 1:
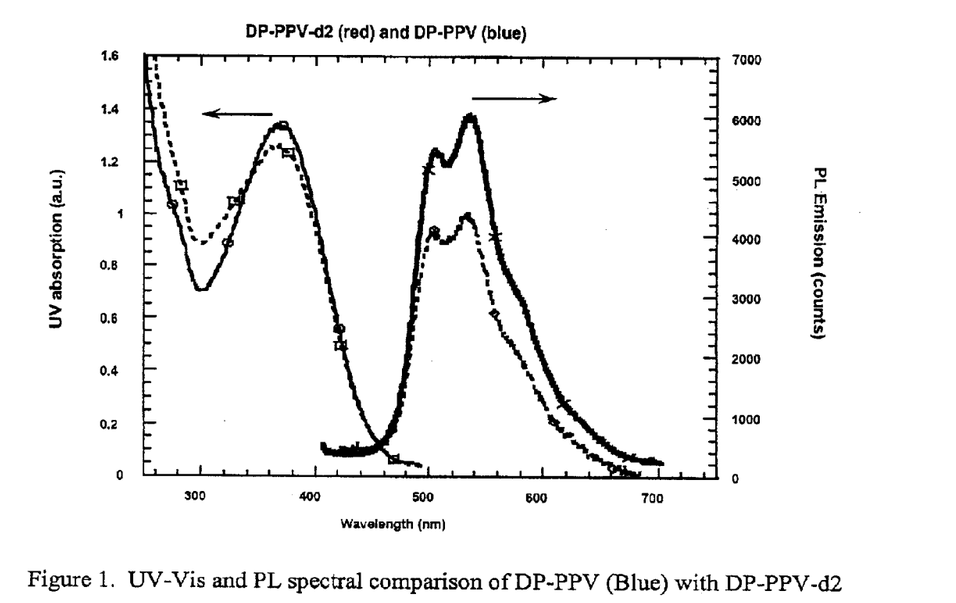
FIG. 1 is a graphical comparison of the UV-visible and photoluminescent spectral characteristics of DP-PPV (Blue) with DP-PPV-d2 (Red).

Compared with the normal DP-PPV, the duterated DP-PPV-d2 has similar optical and electronic absorption properties, as can be seen from FIG. 1.

Scheme 1. Preparation of DP-PPV-d2

EXAMPLE 2
Cyclic Voltametric Analysis

Figure 2:
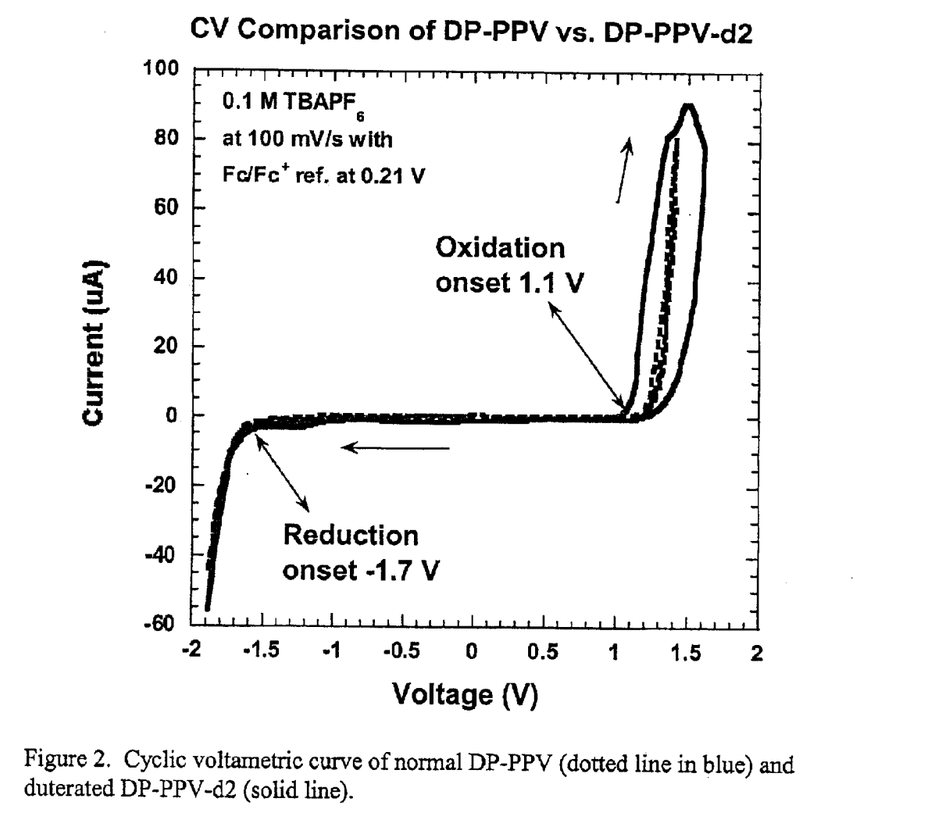
FIG. 2 is a graph showing the cyclic voltametric curve of normal DP-PPV and deuterated DP-PPV-d2.

From a cyclic voltametric analysis, the band gap of the polymer can be estimated as, Eg=2.8 eV; and the energy level for the highest occupied molecular orbitals (HOMO) being=5.9 eV, and for the lowest occupied molecular orbitals being (LUMO)=3.1 eV. The reduction position and the cyclic voltametric features for both normal DP-PPV and DP-PPV-d2 are similar. However, the oxidation position and features of the two polymers are different, as illustrated in FIG. 2. The deuterated DP-PPV-d2 shows a better hole injection as indicated by the larger oxidation peak area in FIG. 2.

EXAMPLE 3
UV Stability Comparison

Figure 3:
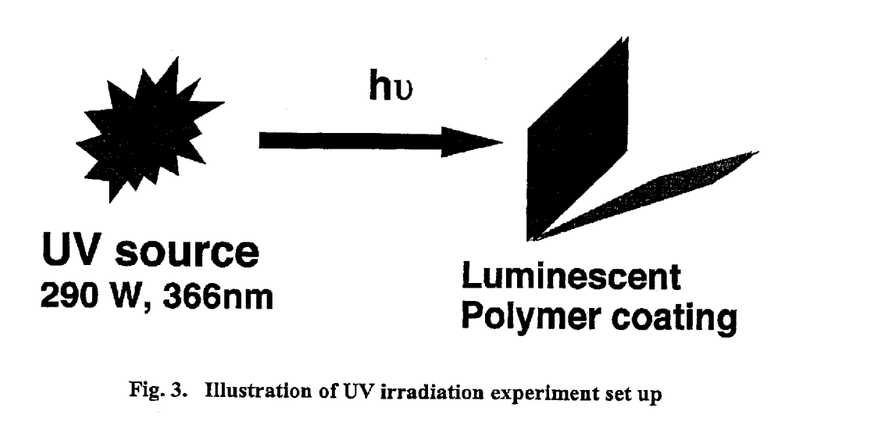
FIG. 3 is an illustration of a UV irradiation experiment set-up.

A DP-PPV polymer sample and a DP-PPV-d2 polymer sample were coated on quartz glass substrates respectively, and subjected to UV irradiation under nitrogen as illustrated in FIG. 3.

After 100 minutes UV irradiation (290 W, 366 nm) under nitrogen atmosphere, the normal DP-PPV sample showed photoluminescence of 80% of its original intensity due to photo-degradation. The DP-PPV-d2 deuterium sample, however, showed 95% of its original photoluminescence intensity.

EXAMPLE 4
OLED Property Comparison

A solution of a DP-PPV-d2 polymer (where X=Y=H, $R_1$=H and $R_2$=$C_{10}H_{21}$ (40 mg dissolved in 2 mL chloroform) is prepared and filtered through a filter with a pore size of less than 0.45 microns. A polymer thin film of PEDOT (Baytron®) is formed by spin-coating an aqueous solution of PEDOT on a pre-coated ITO glass substrate (1.5×1.0 inch, resistivity less than 50 ohm/in$^2$) at 2000 rpm and at room temperature for a spin-time of 1.5 minutes. The thin film of PEDOT is used as a hole injection layer. The deuterium polymer is spin-coated on top of the PEDOT film by similar spin-coating techniques to form an emissive layer. The emissive layer has a uniform thickness of about 100 nm. A layer of calcium, with a thickness of 60 nm, is deposited on top of the polymer film by vacuum thermal evaporation at a rate of 0.2–2.2 nm/sec. A layer of Al with a thickness of 150 nm is deposited on top of the Ca layer at a rate of 2.2–12 nm/sec. The formed OLED device ITO/PEDOT/DP-PPV-d2/Ca—Al is encapsulated by gluing a cover glass substrate on top of the aluminum cathode. The metal evaporation and encapsulation of the device are carried out in a dry box under an argon atmosphere. Stable and uniform green light emission is achieved at a forward bias of 5 volts.

For comparison, a similar device of ITO/PEDOT/DP-PPV/Ca—Al was also fabricated using a normal DP-PPV (without deuterium, where X=Y=H, $R_1$=H and $R_2$=$C_{10}H_{21}$) as the emissive layer. Green electroluminescence can be observed at a forward bias of 4 volts, but after 2 weeks storage the "normal" DP-PPV polymer produced less stable light emission than the deuterium containing polymer.

Luminescent polymers according to the present invention can be used in optically pumped laser devices. Optically pumped laser devices can be made having a variety of structures, including the following:

1. A vertical microcavity-luminescent polymer layer using a polymer according to the present invention can be coated onto a commercially available Diffraction Bragg Resonance (DBR) mirror. A silver mirror is then deposited on top of the polymer layer;

2. A polymer selected from among the polymers of the present invention can be coated in the shape of a disk, ring or sphere onto a plate or rod-shaped material, as known in the art. Such materials include aluminum and copper;

3. An in-plane Fabry-Perot polymer is selected from among those of the present invention and is coated on a cladding material. The cladding has a higher index of refraction than the polymer, but an index of refraction less than about 1.8. Such cladding materials are selected to be resistant to typical organic solvents and polymers. Examples of such materials include $TiO_2$ and $SiO_2$. The cladding materials are usually coated onto semiconductor materials, such as Si or InP by known sputtering deposition techniques; and 4. A distributed feedback (DFB) polymer selected from among the polymers of the present invention is coated on top of a specially designed distributed feedback plate, which is typically an insulator material such as rubber or ceramics, etc. Such a feedback plate is designed to have periodic modulation of either the refractive index or the gain coefficient.

The above mentioned devices can be pumped by a laser source with wavelengths of 300–550 nm. Various laser sources within these wavelengths are commercially available. For instance, one can employ a frequency doubled output of a regeneratively amplified femtosecond (fs) Ti:sapphire laser. This laser source can product a pulse duration of less than 150 fs at a wavelength of 400 nm with a pulse energy of 0.1 nJ to 5000 nJ. The pump beam is focused onto a spot with a diameter of approximately 20–2000 µm, more preferably around 200 µm.

EXAMPLE 5

Optically Pumped Laser Device

Figure 5:
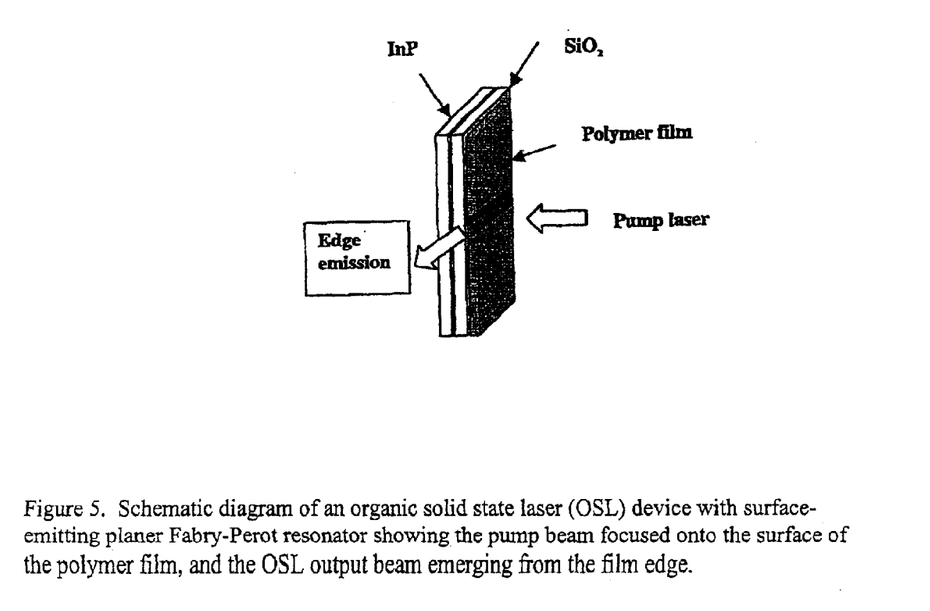
FIG. 5 is a schematic diagram of an organic solid state laser (OSL) device showing the pump beam focused onto the surface of the polymer film.

A polished InP substrate is pre-coated with a 2-µm-thick layer of $SiO_2$ (deposited by plasma enhanced chemical vapor deposition). The polymer (DP-PPV-d) is coated on the surface (100) of the $SiO_2$ by spin coating. The polymer film (refractive index n=1.8) forms a slab optical wave guide with the $SiO_2$ cladding layer (n=1.46) on one side, and air (n=1) on the other. The thickness of the organic film was chosen in order to form a single mode slab wave guide confining the optical field in the gain region. The OSL is optically pumped with 500 ps pulses generated at a 50 Hz repetition rate by a nitrogen laser at lambda=337 nm. The pump beam was focused onto a 50-µm-wide stripe on the surface of the organic film forming the gain region. At pump level above threshold (4 nJ), a well defined green laser beam is clearly observed emerging from the edges of the film (FIG. 5).

An organic laser device can also be constructed in accordance with the present invention. Such a device would have a cathode with a low work function of less than 4.5 eV and an anode with a higher work function of more than 4.8 eV, together with an active layer containing a luminescent polymer according to the present invention.

What is claimed is:

1. An organic light emitting device comprising:
   (a) a transparent electrode;
   (b) a cathode; and
   (c) an active layer containing a luminescent polymer according to any one of the following formulas 1 through 6:

Formula 1

Formula 2

Formula 3

Formula 4

Formula 5

Formula 6 wherein D represents deuterium;
wherein n is an integer greater than 3;
wherein X and Y are each independently selected from the group consisting of F, Cl, Br, CN, $NO_2$, $OR_1$, $SR_1$, phenyl, pyridyl or thiophene; and
wherein $R_1$, $R_2$ are independently each selected from the group consisting of H, alkyl $C_1$–$C_{20}$, $C_1$–$C_{20}$ alkoxyl, F, Cl and Br.

2. An organic light emitting device according to claim 1, wherein X and Y are different.

3. A method for making the organic light emitting device of either of claim 1 or 2, comprising the step of placing the luminescent polymer as the emissive layer between two electrodes.

4. A method for making the organic light emitting device of either of claim 1 or 2, comprising the steps of using $LiAlD_4$ as the deuterium source to include deuterium on a vinyl group of the luminescent polymer.

* * * * *